(12) United States Patent
Jeon et al.

(10) Patent No.: US 8,982,599 B2
(45) Date of Patent: Mar. 17, 2015

(54) CHIP DIE AND SEMICONDUCTOR MEMORY DEVICE INCLUDING THE SAME

(71) Applicant: SK Hynix Inc., Icheon-si, Gyeonggi-do (KR)

(72) Inventors: Seon Kwang Jeon, Icheon-si (KR); Sung Soo Ryu, Seongnam-si (KR); Chang Il Kim, Busan (KR)

(73) Assignee: SK Hynix Inc., Gyeonggi-do (KR)

( * ) Notice: Subject to any disclaimer, the term of this patent is extended or adjusted under 35 U.S.C. 154(b) by 92 days.

(21) Appl. No.: 13/948,616

(22) Filed: Jul. 23, 2013

(65) Prior Publication Data

US 2014/0241079 A1    Aug. 28, 2014

(30) Foreign Application Priority Data

Feb. 27, 2013 (KR) ......................... 10-2013-0020978

(51) Int. Cl.
*G11C 5/06* (2006.01)
*G11C 5/04* (2006.01)
*G11C 7/10* (2006.01)

(52) U.S. Cl.
CPC ............... *G11C 5/04* (2013.01); *G11C 7/1048* (2013.01); *G11C 7/1069* (2013.01)
USPC ........................... 365/63; 365/51; 365/230.06

(58) Field of Classification Search
CPC .......... G11C 5/002; G11C 5/04; G11C 5/063; G11C 7/1048; G11C 7/1069
USPC ............. 365/51, 52, 63, 191, 230.06, 230.08, 365/189.03
See application file for complete search history.

(56) References Cited

U.S. PATENT DOCUMENTS

| 7,269,699 | B2 * | 9/2007 | Jang ............................... 711/154 |
| 7,498,847 | B2 * | 3/2009 | Park .............................. 326/127 |
| 8,243,486 | B2 * | 8/2012 | Riho ............................... 365/51 |
| 8,405,438 | B2 * | 3/2013 | Satani et al. ................... 327/162 |
| 8,599,641 | B2 * | 12/2013 | Yoko et al. .................. 365/233.1 |
| 8,681,525 | B2 * | 3/2014 | Sato ................................. 365/63 |
| 8,687,443 | B2 * | 4/2014 | Shin et al. ..................... 365/200 |
| 2005/0005053 | A1 | 1/2005 | Jang |
| 2007/0176638 | A1 | 8/2007 | Park |
| 2012/0038403 | A1 | 2/2012 | Satani et al. |
| 2012/0201068 | A1 * | 8/2012 | Ware ................................ 365/63 |

FOREIGN PATENT DOCUMENTS

| JP | 2011019189 A | 1/2011 |
| JP | 2012044256 A | 3/2012 |
| KR | 1020050003894 A | 1/2005 |
| KR | 1020060002479 A | 1/2006 |
| KR | 100715392 B1 | 4/2007 |
| KR | 1020070096151 A | 10/2007 |

* cited by examiner

*Primary Examiner* — Gene Auduong
(74) *Attorney, Agent, or Firm* — William Park & Associates Patent Ltd.

(57) ABSTRACT

A chip die including a first input/output (I/O) pad configured to transmit/receive an I/O signal of a memory cell array included in the chip die; a second I/O pad configured to, if a stacked chip die exists on the chip die, transmit/receive a via I/O signal of the stacked chip die, and configured to, if the stacked chip die does not exist on the chip die, transmit/receive a differential I/O signal of the chip die; and an I/O driver configured to receive an operation mode signal including information as to whether the stacked chip die exists on the chip die in such a manner that the second I/O pad is configured to transmit/receive the via I/O signal or the differential I/O signal.

20 Claims, 6 Drawing Sheets

CHIP DIE AND SEMICONDUCTOR MEMORY DEVICE INCLUDING THE SAME

CROSS-REFERENCE TO RELATED APPLICATION

This application claims priority based upon Korean patent application No. 10-2013-0020978, filed on Feb. 27, 2013, the disclosure of which is hereby incorporated in its entirety by reference herein.

BACKGROUND OF THE INVENTION

1. Technical Field

Embodiments of the present invention generally relate to a semiconductor memory device and a method for driving the same, and more particularly to a chip die capable of being stacked, a semiconductor memory device including the chip die, and a method for driving the semiconductor memory device.

2. Related Art

Semiconductor memory devices have been widely used in various electronic appliances. The semiconductor memory device aims to improve its operation speed as well as to implement its miniaturization. Dynamic Random Access Memory (DRAM) serving as a representative semiconductor memory device has been manufactured to improve the operation speed, and is appropriate for a high-speed operation.

Joint Electron Device Engineering Council (JEDEC) serving as a semiconductor standardization organization has selected a wide Input/Output (I/O) scheme considering a parallel-interface Low Power Double Data Rate (LPDDR) and a chip die stack as the next-generation DRAM scheme. A plurality of semiconductor companies persistently makes efforts to develop DRAMs having more improved functions on the basis of JEDEC standard.

With the rapid development of mobile devices, the next-generation DRAMs need to be optimized for such mobile devices. The next-generation DRAMs have been rapidly developed to have smaller sizes and lower power consumption. Specifically, various attempts (e.g., voltage scaling, structural improvement, new I/O signaling, and signal-integration improvement) have been made to achieve low power consumption as well as to compensate for power trade-off suitable for the demand of a high-speed memory.

BRIEF SUMMARY OF THE INVENTION

Various embodiments of the present invention are directed to providing a chip die and a semiconductor memory device including the same that substantially obviate one or more problems due to limitations and disadvantages of the related art.

An embodiment of the present invention relates to a chip die capable of being stacked and a semiconductor memory device including the chip die such that the semiconductor memory device is configured to selectively use a dummy pad needed for I/O operations of other chip dies that is located above or below a single chip die within the single chip die.

An embodiment of the present invention relates to a semiconductor memory device configured to determine whether a plurality of stackable chip dies is stacked, and selectively use a dummy pad needed for other stacked chip dies as a differential I/O pad of the corresponding chip die.

An embodiment of the present invention relates to a semiconductor memory device including a chip die and a method for driving the same, which are configured to perform a single or differential I/O operation by determining whether a plurality of stackable chip dies is stacked. The chip die may increase reliability of I/O signal decision through a differential I/O operation and at the same time may increase integration degree.

In accordance with an embodiment of the present invention, a chip die includes: a first input/output (I/O) pad configured to transmit/receive an I/O signal of a memory cell array included in the chip die; a second I/O pad configured to, if a stacked chip die exists on the chip die, transmit/receive a via I/O signal of the stacked chip die, and configured to, if the stacked chip die does not exist on the chip die, transmit/receive a differential I/O signal of the chip die; and an I/O driver configured to receive an operation mode signal including information as to whether the stacked chip die exists on the chip die in such a manner that the second I/O pad is configured to transmit/receive the via I/O signal or the differential I/O signal.

The I/O driver may be configured to select the via I/O signal when the operation mode signal corresponds to a first state, and may be configured to select the differential I/O signal when the operation mode signal corresponds to a second state.

The chip die may be electrically coupled to the stacked chip die through a Through Silicon Via (TSV).

The chip die may further include: a detect-signal generator configured to generate a chip-die detect signal in response to a power-up signal.

In accordance with other embodiments of the present invention, a semiconductor memory device includes: a System on Chip (SoC) including a controller, configured to determine an operation mode of a first chip die by detecting whether a different chip die is stacked on the first chip die, and generate an operation mode signal according to the determined operation mode, wherein the first chip die is formed over the SoC, and is configured to perform a single or differential I/O operation on the basis of the operation mode signal.

The first chip die may include: a first I/O pad configured to transmit/receive an input/output (I/O) signal of an internal memory cell array; a second I/O pad configured to, if a second chip die stacked on the first chip die exists, transmit/receive a via I/O signal corresponding to an I/O signal of the second chip die, and configured to, if the second chip die does not exist, transmit/receive a differential I/O signal of the memory cell array; and an I/O driver configured to provide the I/O signal to the first I/O pad on the basis of the operation mode signal based on the presence or absence of the second chip die, and provide the via I/O signal or the differential I/O signal to the second I/O pad.

The first chip die may further include a first detect-signal generator configured to generate a first chip-die detect signal in response to a power-up signal.

The first chip-die detect signal may be coupled to a first voltage of the SoC.

The SoC may be electrically coupled to the first chip die through the first and second I/O pads, and include a die detect terminal for detecting the chip dies stacked on the SoC.

The controller may be configured to generate the operation mode signal on the basis of a voltage level of the die detect terminal.

The die detect terminal may be configured to receive a chip-die detect signal of a second chip die group capable of being stacked on the first chip die.

The semiconductor memory device may further include the second chip die including a third I/O pad that is electrically coupled to a second I/O pad of the first chip die through a Through Silicon Via (TSV).

The second chip die may further include a second detect-signal generator configured to generate a second chip-die detect signal in response to a power-up signal.

The controller may be configured to determine the operation mode signal on the basis of the second chip-die detect signal.

If the second chip-die detect signal may be detected, the controller may enable the first chip die to perform a differential I/O operation.

In accordance with an embodiment of the present invention, a chip die includes: a first input/output (I/O) pad configured to transmit/receive an I/O signal of a memory cell array included in the chip die; a second I/O pad configured to, if another chip die exists, transmit/receive a via I/O signal of the another chip die, otherwise, transmit/receive a differential I/O signal of the chip die; and an I/O driver configured to receive an operation mode signal including information as to whether the another chip die exists in such a manner that the second I/O pad is configured to transmit/receive the via I/O signal or the differential I/O signal.

It is to be understood that both the foregoing general description and the following detailed description of the present invention are exemplary and explanatory and are intended to provide further explanation of the invention as claimed.

BRIEF DESCRIPTION OF THE DRAWINGS

The above and other features and advantages of the present invention will become readily apparent by reference to the following detailed description when considered in conjunction with the accompanying drawings.

DETAILED DESCRIPTION

Reference will now be made in detail to the embodiments of the present invention, examples of which are illustrated in the accompanying drawings. Wherever possible, the same reference numbers will be used throughout the drawings to refer to the same or like parts.

In association with the embodiments of the present invention, specific structural and functional descriptions are disclosed only for illustrative purposes, the embodiments of the present invention can be implemented in various ways without departing from the scope or spirit of the present invention.

Figure 1:
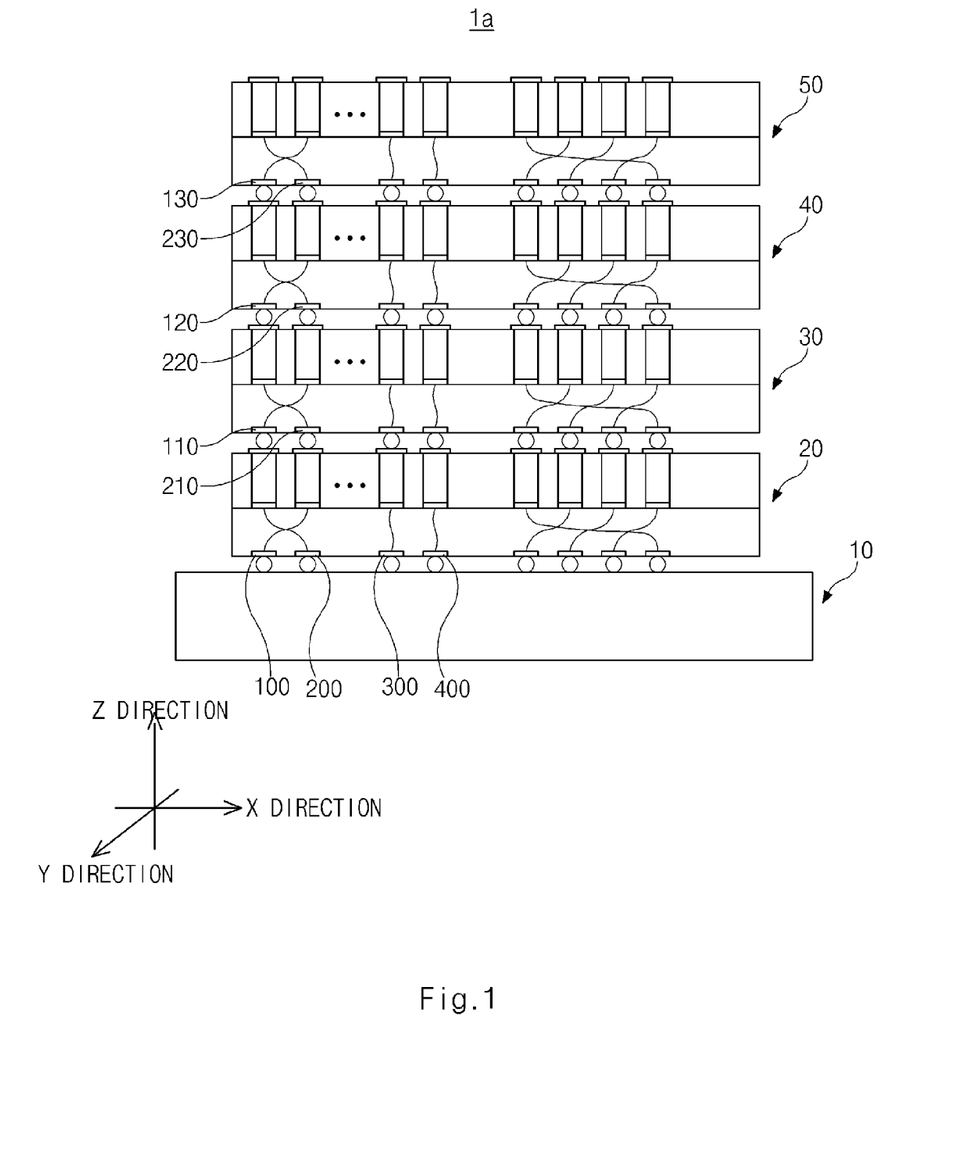
FIG. 1 is a cross-sectional view illustrating a semiconductor memory device in which a plurality of chip dies is stacked.

FIG. 1 is a cross-sectional view illustrating a semiconductor memory device in which a plurality of chip dies are stacked.

The cross-sectional view of the semiconductor memory device shown in FIG. 1 is shown on the basis of an X-direction, a Y-direction, and a Z-direction, such that it has the same Y coordinates on the basis of the X-Y-Z directions.

Referring to FIG. 1, the semiconductor memory device 1a may include a plurality of chip dies (20, 30, 40, 50) on SoC (System on Chip) 10. The chip dies (20, 30, 40, 50) may be electrically interconnected through a Through Silicon Via (TSV).

In accordance with the scheme for electrically interconnecting the chip dies (20, 30, 40, 50) through TSVs, the scheme for connecting individual TSVs through external or internal wiring of the chip dies may be changed to another.

For example, the first chip die 20 may be electrically coupled to an SoC 10 through a first I/O pad 100 and a second I/O pad 200. The first I/O pad 100 and the second I/O pad 200 may be cross-coupled to internal TSVs through wiring.

In accordance with an embodiment, the first I/O pad 100 may correspond to an active I/O pad for transmitting/receiving an output signal of the first chip die 20 and input signals applied to internal circuits of the first chip die 20. For example, the first I/O pad 100 may also be referred to as a DQ pad. Unlike the first I/O pad 100, the second I/O pad 200 does not transmit/receive signals generated from/applied to the first chip die 20, and may correspond to a dummy I/O pad for transmission of signals of other chip dies (e.g., chip dies 30, 40 and 50) capable of being stacked above or below the first chip die 20.

In accordance with the embodiments, output signals generated from other chip dies other than a specific chip die including the I/O pad or input signals applied to other chip dies other than the specific chip die are generically referred to as "via I/O signals". For example, the second I/O pad 200 (i.e., dummy I/O pad) of the first chip die 20 may transfer I/O signals (i.e., via I/O signals) of the second chip die 30 or the fourth chip die 50.

Therefore, although the dummy I/O pad may be originally formed in a stackable chip die through the manufacturing process, the dummy I/O pad does not perform I/O functions of a specific signal and occupies a predetermined region within the chip die when another chip die is not stacked above or below the corresponding chip die. Therefore, according to an embodiment of the present invention, the dummy I/O pad selectively performs I/O functions. For example, when multiple chip dies are stacked, the dummy I/O pad may be used as a transmission/reception passage of I/O signals of other chip dies. In contrast, when at least one chip die is not stacked (i.e., only single chip die is stacked on the SOC), the dummy I/O pad may be configured to transmit/receive differential I/O signals for improving reliability of the I/O operation.

In order to allow the dummy I/O pad of the chip die to perform differential operations according to whether or not other chip dies are stacked, it is determined whether other dies are stacked on the chip die so as to establish the operation of the chip die. In accordance with other embodiments, the operation of the dummy I/O pad may be directly selected by an external part as necessary. A structure for determining whether the chip die is stacked will be described later with reference to FIG. 5.

The first and second I/O pads 100 and 200 of the first chip die 20 formed over the SoC 10 of the semiconductor memory device 1a may be electrically coupled to the second chip die 30 through a TSV. In more detail, the first chip die 20 is coupled to the first and second I/O pads 110 and 210 of the second chip die 30. Referring to FIG. 1, from the viewpoint of a plan view of the semiconductor memory device 1a, i.e., from the viewpoint of a Z-axis direction of the semiconductor memory device 1a, the first I/O pad 100 of the first chip die 20 may not be coupled to the first I/O pad 110 of the second chip die 30. Here, the first I/O pad 100 of the first chip die 20 and the first I/O pad 110 of the second chip die 30 are located at the same X and Y positions.

In contrast, the first I/O pad 100 of the first chip die 20 is electrically coupled to the second I/O pad 210 of the second chip die 30, and the second I/O pad 200 of the first chip die 20 is electrically coupled to the first I/O pad 110 of the second chip die 30. Here, the first I/O pad 100 of the first chip die 20 and the second I/O pad 210 of the second chip die 30 have different X coordinates, and the second I/O pad 200 of the first chip die 20 and the first I/O pad 110 of the second chip die 20 have different X coordinates. The above-mentioned connection scheme is achieved by interconnection between each pad and a TSV. In accordance with the above-mentioned connection scheme, the first I/O pad 110 of the second chip die 30 may operate as an active I/O pad, and the second I/O pad 210 of the second chip die 30 may operate as a dummy I/O pad. In this case, the first I/O pad 110 of the second chip die 30 may transmit an output signal to the SoC 10 through the second I/O pad 200 of the first chip die 20, or may receive an input signal from the SoC 10.

Likewise, the first I/O pad 120 of the third chip die 40 acting as an active I/O pad may be coupled to the SoC 10 not only through the second I/O pad 210 of the second chip die 30 but also through the first I/O pad 100 of the first chip die 20.

Therefore, pads located at the same X and Y coordinates of the chip dies (20, 30, 40, 50) may perform substantially the same function. In other words, the first I/O pad 100 of the first chip die 20, the first I/O pad 110 of the second chip die 30, the first I/O pad 120 of the third chip die 40, and the first I/O pad 130 of the fourth chip die 50 are equally used as the active I/O pads, and the second I/O pads (200, 210, 220, 230) are used as dummy I/O pads.

Therefore, respective chip dies may operate according to the same operation design irrespective of whether the chip dies are stacked or not. Furthermore, the TSVs of the respective chip dies are cross-coupled to one another so as to adjust load balancing. In accordance with an embodiment, TSVs are not cross-coupled to each other, and TSVs having the same X and Y coordinates may be electrically coupled to each other. The I/O pads (300, 400) of the first chip die 20 may be coupled to pads and TSVs of the second to fourth chip dies (30, 40, 50). Here, the pads and TSVs have the same X and Y coordinates.

If the I/O pads (300, 400) are coupled to the pads and TSVs having the same X and Y coordinates, the same power-supply voltage and the same signal may be input to respective chip dies (20, 30, 40, 50).

Figure 2A:
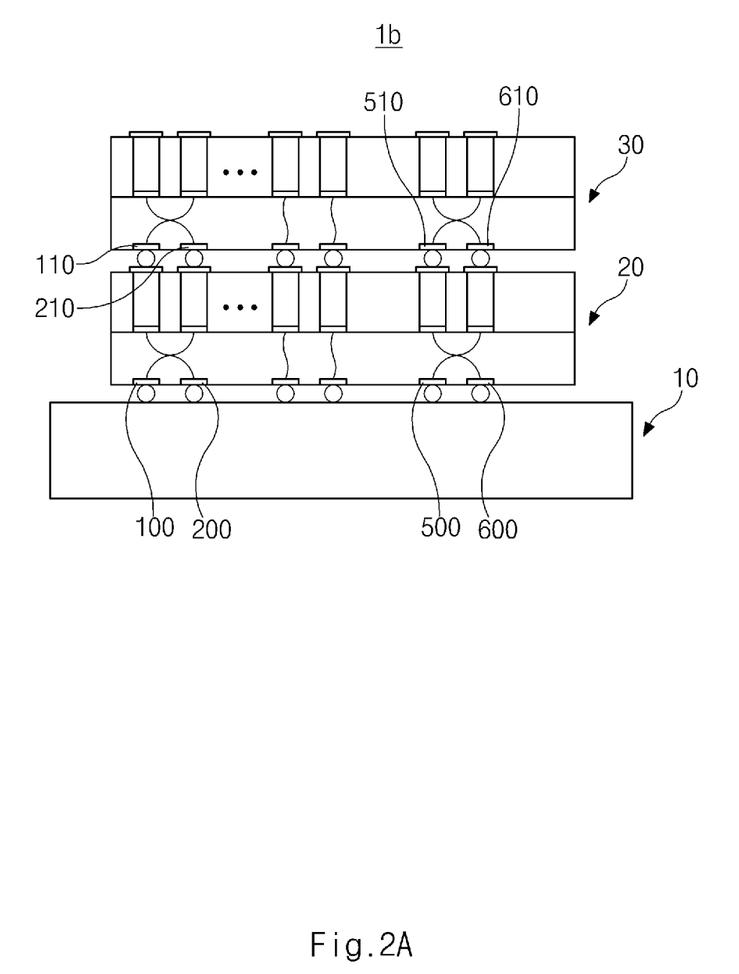
FIGS. 2A and 2B are cross-sectional views illustrating the semiconductor memory devices according to embodiments of the present invention.
Figure 2B:
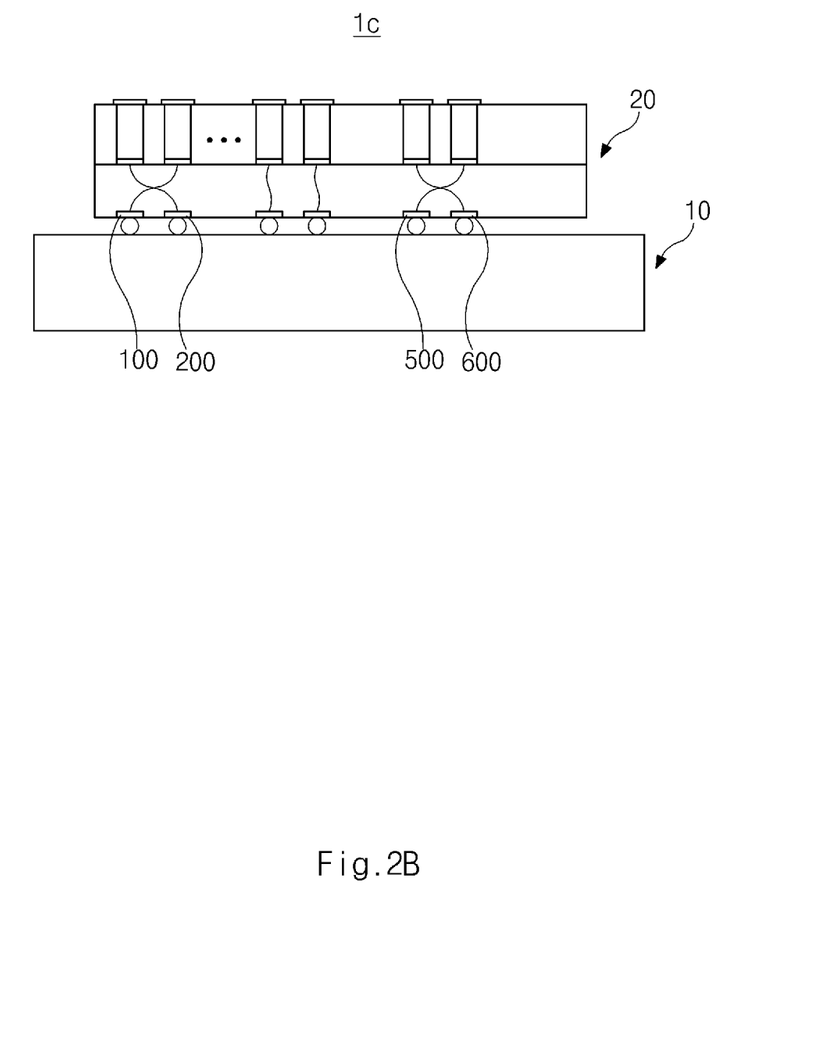

FIGS. 2A and 2B are cross-sectional views illustrating the semiconductor memory devices according to embodiments of the present invention.

FIG. 2A is a cross-sectional view illustrating the semiconductor memory device 1b in which the second chip die 30 is stacked on the first chip die 20. FIG. 2B is a cross-sectional view illustrating the semiconductor memory device 1c in which another chip die is not stacked on the first chip die 20 so that the semiconductor memory device 1c may operate as a single chip die.

As shown in FIG. 2A, the first I/O pad 100 of the first chip die 20 is electrically coupled to the second I/O pad 210 of the second chip die 30, and the second I/O pad 200 of the first chip die 20 is electrically coupled to the first I/O pad 110 of the second chip die 30.

Accordingly, each of the first I/O pad 100 of the first chip die 20 and the first I/O pad 110 of the second chip die 30 may operate as the active I/O pad. Each of the second I/O pad 200 of the first chip die 20 and the second I/O pad 210 of the second chip 30 may operate as the dummy I/O pad.

However, although the second I/O pad 200 of the first chip die 20 is a dummy pad for the first chip die 20, because the second I/O pad 200 of the first chip die 20 is electrically coupled to the first I/O pad 110 of the second chip die 30 so as to transmit/receive signals to/from the SoC 10, the second I/O pad 200 is configured to perform a predetermined function for the semiconductor memory device 1b.

The first chip die 20 may include a first chip selection pad 600 and a second chip selection pad 500 for chip-die selection. In addition, the second chip die 30 may include a first chip selection pad 610 and a second chip selection pad 510. The chip selection pads (500, 600, 510, 610) of individual chip dies (20, 30) may allow a plurality of pads located at the same X and Y coordinates to perform the same function in the same manner as in the I/O pads (100, 200, 110, 210). For example, when selecting the first chip die 20, the chip selection (CS) signal may be applied through the first chip selection pad 600 of the first chip 20. When selecting the second chip die 30, the chip selection (CS) signal may be applied through the second chip selection pad 500 of the first chip die or the first chip selection pad 610 of the second chip die 30.

Figure 5:
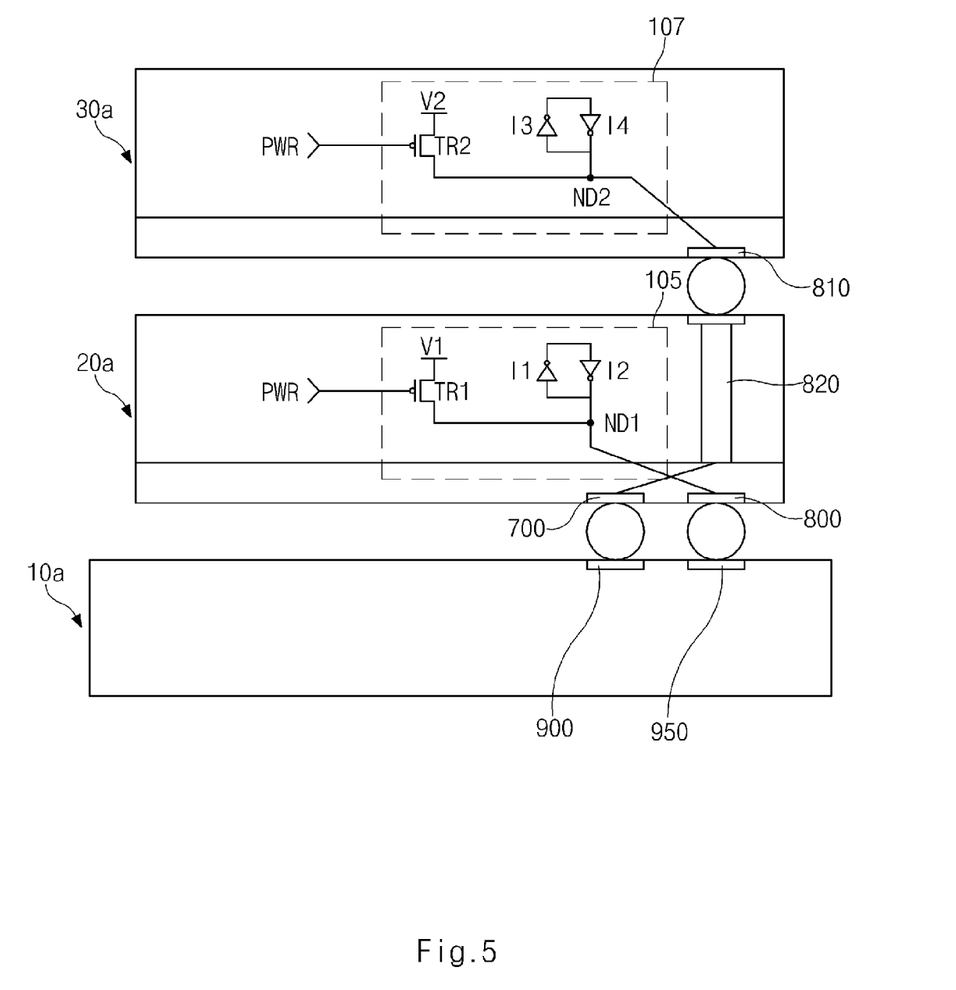
FIG. 5 is a detailed circuit diagram illustrating a detect-signal generator according to an embodiment of the present invention.

Although the chip die may be selected through the above chip selection pads as shown in FIG. 5, it should be noted that the chip-die detecting operation may also be performed. However, according to embodiments, the same pad may be used or a pad different from that of the chip selection may be used for the chip-die detecting operation.

In accordance with the semiconductor memory device 1c shown in FIG. 2B, other chip dies are not stacked on the first chip die 20 such that the first chip die 20 is used as a single chip. Assuming that other chip dies are not stacked on the first chip die 20, the second I/O pad 200 of the first chip die 20 does not transmit/receive any other signals, and occupies only the space without having a separate function within the first chip die 20. Therefore, the second I/O pad of the first chip die 20 is configured to perform differential I/O operations according to an embodiment.

The first chip die 20 according to an embodiment is configured to transmit/receive a differential I/O signal, which is complementary to the I/O signal supplied through the first I/O pad 100, through the first I/O pad 100 of the first chip die 20. The second I/O pad may be configured to transmit/receive via I/O signals corresponding to I/O signals of a different chip die (for example, the second chip die 30) stacked as shown in FIG. 2A, or may be configured to selectively transmit/receive a differential I/O signal of the corresponding chip die (i.e., the second chip die 20) as shown in FIG. 2B.

The above-mentioned selective operation of the second I/O pad 200 may be performed on the basis of the operation mode signal based on an external control signal for deciding the operation mode. In accordance with the embodiments, the operation mode signal may be determined by direct designation of a user or may be determined by a manufacturer of the semiconductor memory device. As can be seen from FIG. 5, the controller of the semiconductor memory device determines whether the chip die is stacked to generate an operation mode decision signal, such that the operation mode decision signal can be provided to each chip die. Therefore, when considering the chip die capable of being stacked, the chip die according to an embodiment may be operated by a single or differential I/O scheme according to whether the chip die is stacked, such that the chip die can be flexibly operated with the design extensibility. Although the chip dies are stacked according to an embodiment, I/O time points of individual dies are differently decided in such a manner that each chip die is configured to perform a differential I/O operation.

Figure 3:
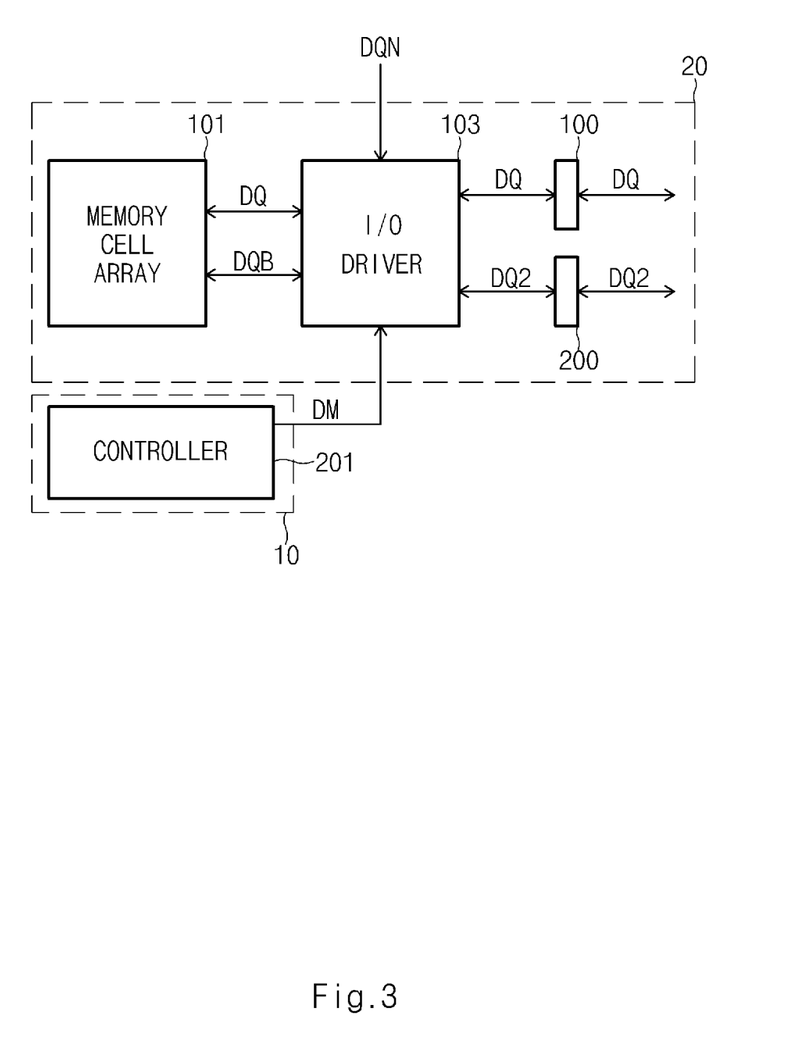
FIG. 3 is a block diagram illustrating a circuit implemented in each chip die of the semiconductor memory device according to an embodiment of the present invention.

FIG. 3 is a block diagram illustrating a circuit implemented in each chip die of the semiconductor memory device according to an embodiment of the present invention.

Referring to FIG. 3, the first chip die 20 may include a memory cell array 101, an I/O driver 103, a first I/O pad 100, and a second I/O pad 200. Although an example of the first chip die 20 is shown in FIG. 3, circuits shown in the first chip die 20 of FIG. 3 may also be embodied in individual stackable chip dies (for example, the second to fourth chip dies 30~50 of FIG. 1).

The memory cell array 101 may include a plurality of volatile or non-volatile memory cells. Although not shown in FIG. 3, it should be understood that the memory cell array 101 may include a plurality of I/O circuits for providing an input signal and reading an output signal. Therefore, the memory cell array 101 may output/receive an I/O signal (DQ), or may output/receive a differential I/O signal (DQB).

The differential I/O operation may recognize and decide data by comparing a differential I/O signal (DQB) with an I/O signal (DQ), such that it guarantees the read or write margin and increases the reliability of data decision. The differential I/O operation may be implemented by various methods well known to those skilled in the art before the filing of this application, and as such a detailed description thereof will be omitted herein.

The I/O driver 103 is selectively coupled to the second I/O pad 200 according to the operation scheme decided by an operation mode (DM) signal. In accordance with an embodiment, if the decided operation scheme corresponds to a single I/O operation, the second I/O pad 200 is not coupled to a memory cell array 101 of the first chip die 20. In this case, the second I/O pad 200 may be configured to receive a via I/O signal (DQN) corresponding to at least one I/O signal from among I/O signals of the second to fourth chip dies (30, 40, 50) stacked on the first chip die 20. In accordance with an embodiment, the second I/O pad 200 may be floated without receiving other I/O signals.

The decided operation scheme may provide the operation mode (DM) signal to the I/O driver 103. As described above, the decided operation scheme may be provided through a signal designated by an external part, or may be generated by the SoC 10's controller 201 configured to determine whether the chip die is stacked.

The second I/O pad 200 may provide a differential I/O signal (DQB) or a via I/O signal (DQN) on the basis of the operation mode (DM) signal. In FIG. 3, DQB and DQN are generically referred to as 'DQ2'.

The first I/O pad 100 of the first chip die 20 is configured to transmit/receive the I/O signal (DQ) irrespective of the operation mode (DM) signal.

Figure 4:
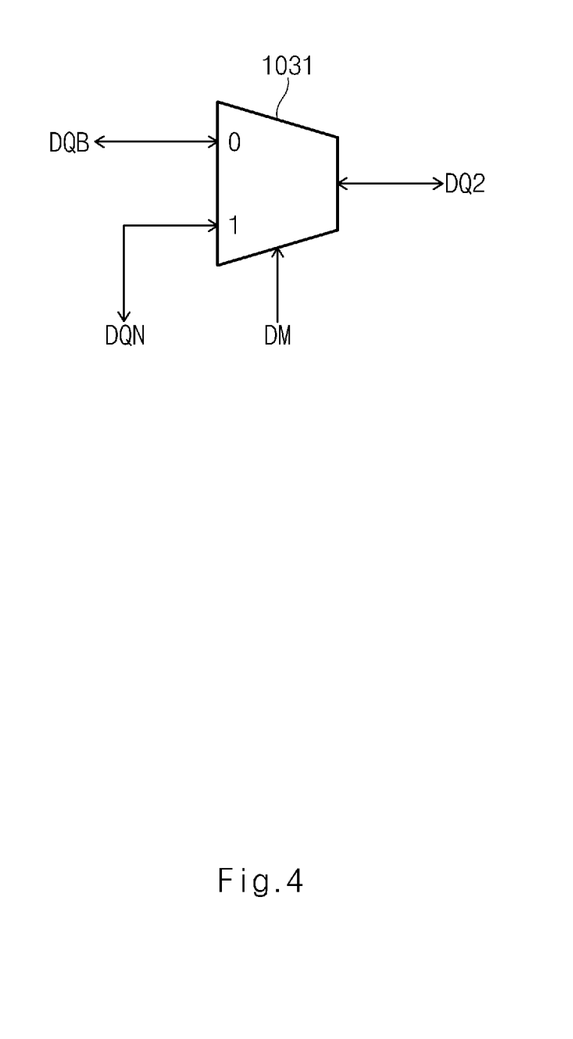
FIG. 4 is a circuit diagram illustrating a selector included in an I/O driver of FIG. 3.

FIG. 4 is a circuit diagram illustrating a selector included in the I/O driver of FIG. 3.

Referring to FIG. 4, the selector 1031 outputs a differential I/O signal (DQB) or a via I/O signal (DQN) as a signal DQ2 on the basis of the operation mode (DM) signal.

The selector 1031 may be implemented as a general multiplexer or demultiplexer.

FIG. 5 is a detailed circuit diagram illustrating a detect-signal generator according to an embodiment of the present invention.

Referring to FIG. 5, the chip die (20a or 30a) according to an embodiment may include the detect-signal generator (105 or 107), such that the SoC 10a may determine the presence or absence of each chip die 20a or 30a. The detect-signal generator 105 or 107 may generate a chip-die detect signal in response to a power-up signal PWR, and output the chip-die detect signal to the controller of the SoC 10a. Specifically, the presence of chip dies (20a, 30a) is detected through a die detect terminal 950 connected to the SoC 10a and the first chip die 20a as shown in FIG. 5, such that the operation mode (DM) signal for determining the operation mode can be generated according to the detection result.

The first chip die 20a and the second chip die 30a stacked on the SoC 10a may include a first detect-signal generator 105 and a second detect-signal generator 107, respectively. Each detect-signal generator 105 or 107 may operate in response to the power-up signal PWR. The power-up signal PWR may be an initial setting voltage through which an initial voltage level of each chip die 20a or 30a may be constantly established during the initial operation mode, or may be an arbitrary external signal for determining whether the chip dies (20a, 30a) are stacked externally.

The first detect-signal generator 105 may include a first transistor TR1 and the first and second inverters (I1, I2) constructing a latch.

The first transistor TR1 is coupled between a first voltage V1 and a first node ND1, such that it may provide the first voltage V1 to the first node ND1 in response to the power-up signal PWR.

The latch comprised of the first and second inverters (I1, I2) is configured to constantly maintain a value of the first node ND1. The first node ND1 is electrically coupled to a first chip-die detect pad 800. The first chip-die detect pad 800 of the first chip die 20a is electrically coupled to a second die-detect terminal 950 of the SoC 10a, and the SoC 10a determines the presence or absence of a first chip die 20a on the basis of a voltage level of the second die-detect terminal 950. For example, if the first chip die 20a exists, the first chip-die detect pad 800 maintains a constant voltage level on the basis of the first chip-detect signal received through the first node ND1. However, if the first chip die 20a does not exist, the first chip-die detect pad 800 maintains an unstable voltage state.

A second detect-signal generator 107 included in the second chip die 30a may include a second transistor TR2 and a latch comprised of third and fourth inverters (I3, I4).

The second transistor TR2 provides a second voltage V2 to a second node ND2 in response to the power-up signal PWR. In accordance with an embodiment, the first voltage V1 is substantially identical in level to the second voltage V2, and may correspond to a power-supply voltage or the like.

In the same manner as in the first detect-signal generator 105, the second detect-signal generator 107 generates a second chip-die detect signal through which the second node ND2 maintains a constant voltage level, and provides the second chip-die detect signal to a first chip-die detect pad 810 of the second chip die 30a. The second chip-die detect signal is applied to a second chip-die detect pad 700 of the first chip die 20a through a TSV 820 of the first chip die 20a, and is then applied to the first die-detect terminal 900 of the SoC 10a through the second chip-die detect pad 700 of the first chip die 20a.

The controller of the SoC 10a detects a voltage level of the first die-detect terminal 900 so as to recognize the presence or absence of the second chip die 30a. Therefore, the semiconductor memory device according to an embodiment detects a voltage level of each die-detect terminal 900 or 950 so as to recognize whether or not the chip dies are stacked on the basis of the detected voltage level.

In accordance with an embodiment, the second die-detect terminal 950 for determining the presence or absence of a chip die of the first chip die 20a directly stacked on the SoC 10a may be coupled to a ground voltage GND. Therefore, the semiconductor memory device may determine the operation mode by detecting a voltage level of the first die-detect terminal 900. For example, assuming that a voltage level of the first die-detect terminal 900 is maintained at a constant voltage level without being floated, this means that the second chip die 30a is stacked. In accordance with an embodiment, if the first die-detect terminal 900 has a first-state voltage level, this means that the second chip die 30a is stacked. If the first die-detect terminal 900 has a second-state voltage level, this means that the second chip die 30a is not stacked.

As described above, the chip-die detect pads (700, 800, 810) shown in FIG. 5 may be implemented with the same pads as the chip-selection pads (500, 600, 510, 610) shown in FIGS. 2A and 2B. In accordance with an embodiment, the chip-die detect pads (700, 800, 810) may also be implemented with separate pads.

Therefore, the controller of the SoC 10a determines whether the chip dies are stacked on the basis of a voltage level of the die-detect terminals (900, 950), determines the operation mode on the basis of the determined result so as to generate the operation mode (DM) signal, and provides the DM signal to each of the chip dies (20a, 30a).

The DM signal may be applied to a plurality of chip dies via TSVs electrically interconnected through cross-coupled wirings, or may be applied to a plurality of chip dies through TSVs having the same X and Y positions.

However, the controller may provide the DM signal on the basis of a command signal received from an external host, irrespective of whether or not the chip dies are stacked.

As described above, under the condition that the semiconductor memory device may include a dummy I/O pad in consideration of a stacked state of the chip die, the chip die and the semiconductor memory device according to an embodiment are selectively operated by a differential I/O terminal when the chip die is not stacked, such that the chip die and the semiconductor memory device can be operated with the extensibility although there is a limitation in the fabrication process.

Furthermore, the chip die is configured to selectively perform a single or differential I/O operation by an external part, irrespective of whether or not the chip die is stacked, such that it is determined whether the chip die or the semiconductor memory device will be operated with high reliability or will be operated at a higher speed. As a result, it is possible to flexibly implement the semiconductor memory device appropriate for an operation situation.

As is apparent from the above description, the semiconductor memory device including a stackable chip die according to the embodiments are configured to selectively use an I/O pad of the stackable chip die as a dummy pad or a differential I/O pad, resulting in increased design flexibility and increased operation reliability.

The semiconductor memory device according to an embodiment recognizes whether the chip die is stacked so as to automatically establish an operation mode of the I/O pads, or establishes an operation mode of the chip die through external establishment, resulting in a guarantee of the operation extensibility of a plurality of chip dies.

Those skilled in the art will appreciate that the present invention may be carried out in other specific ways than those set forth herein without departing from the spirit and essential characteristics of the present invention. The above examples of embodiments are therefore to be construed in all aspects as illustrative and not restrictive. The scope of the invention should be determined by the appended claims and their legal equivalents, not by the above description, and all changes coming within the meaning and equivalency range of the appended claims are intended to be embraced therein. Also, it is obvious to those skilled in the art that claims that are not explicitly cited in each other in the appended claims may be presented in combination as an example of an embodiment of the present invention or included as a new claim by a subsequent amendment after the application is filed.

Although a number of illustrative embodiments consistent with the invention have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A chip die comprising:
a first input/output (I/O) pad configured to transmit/receive an I/O signal of a memory cell array included in the chip die;
a second I/O pad configured to, if a stacked chip die exists on the chip die, transmit/receive a via I/O signal of the stacked chip die, and configured to, if the stacked chip die does not exist on the chip die, transmit/receive a differential I/O signal of the chip die; and
an I/O driver configured to receive an operation mode signal including information as to whether the stacked chip die exists on the chip die in such a manner that the second I/O pad is configured to transmit/receive the via I/O signal or the differential I/O signal.

2. The chip die according to claim 1, wherein the I/O driver is configured to select the via I/O signal when the operation mode signal corresponds to a first state, and is configured to select the differential I/O signal when the operation mode signal corresponds to a second state.

3. The chip die according to claim 1, wherein the chip die is electrically coupled to the stacked chip die through a Through Silicon Via (TSV).

4. The chip die according to claim 2, further comprising:
a detect-signal generator configured to generate a chip-die detect signal in response to a power-up signal.

5. A semiconductor memory device comprising:
a System on Chip (SoC) including a controller, configured to determine an operation mode of a first chip die by detecting whether a different chip die is stacked on the first chip die, and generate an operation mode signal according to the determined operation mode,
wherein the first chip die is formed over the SoC, and is configured to perform a single or differential I/O operation on the basis of the operation mode signal.

6. The semiconductor memory device according to claim 5, wherein the first chip die includes:
a first I/O pad configured to transmit/receive an input/output (I/O) signal of an internal memory cell array;
a second I/O pad configured to, if a second chip die stacked on the first chip die exists, transmit/receive a via I/O signal corresponding to an I/O signal of the second chip die, and configured to, if the second chip die does not exist, transmit/receive a differential I/O signal of the memory cell array; and
an I/O driver configured to provide the I/O signal to the first I/O pad on the basis of the operation mode signal based on the presence or absence of the second chip die, and provide the via I/O signal or the differential I/O signal to the second I/O pad.

7. The semiconductor memory device according to claim 5, wherein the first chip die further includes a first detect-signal generator configured to generate a first chip-die detect signal in response to a power-up signal.

8. The semiconductor memory device according to claim 7, wherein the first chip-die detect signal is coupled to a first voltage of the SoC.

9. The semiconductor memory device according to claim 5, wherein the SoC is electrically coupled to the first chip die through the first and second I/O pads, and includes a die detect terminal for detecting the chip dies stacked on the SoC.

10. The semiconductor memory device according to claim 9, wherein the controller is configured to generate the operation mode signal on the basis of a voltage level of the die detect terminal.

11. The semiconductor memory device according to claim 10, wherein the die detect terminal is configured to receive a chip-die detect signal of a second chip die group capable of being stacked on the first chip die.

12. The semiconductor memory device according to claim 5, further comprising:
the second chip die including a third I/O pad that is electrically coupled to a second I/O pad of the first chip die through a Through Silicon Via (TSV).

13. The semiconductor memory device according to claim 12, wherein the second chip die further includes a second detect-signal generator configured to generate a second chip-die detect signal in response to a power-up signal.

14. The semiconductor memory device according to claim 11, wherein the controller is configured to determine the operation mode signal on the basis of the second chip-die detect signal.

15. The semiconductor memory device according to claim 12, wherein:
if the second chip-die detect signal is detected, the controller enables the first chip die to perform a differential I/O operation.

16. A chip die comprising:
a first input/output (I/O) pad configured to transmit/receive an I/O signal of a memory cell array included in the chip die;
a second I/O pad configured to, if another chip die exists, transmit/receive a via I/O signal of the another chip die, otherwise, transmit/receive a differential I/O signal of the chip die; and
an I/O driver configured to receive an operation mode signal including information as to whether the another chip die exists in such a manner that the second I/O pad is configured to transmit/receive the via I/O signal or the differential I/O signal.

17. The chip die according to claim 16, wherein the I/O driver is configured to select the via I/O signal or the differential I/O signal depending on the operation mode signal.

18. The chip die according to claim 16, wherein the I/O driver is configured to receive an operation mode signal from a system on chip.

19. The chip die according to claim 16, wherein the I/O driver is configured to receive an operation mode signal from an external source.

20. The chip die according to claim 16, wherein the first I/O pad is an active pad and the second I/O pad is a dummy pad.

* * * * *